United States Patent
Yamanoi et al.

[19]

[11] Patent Number: 6,067,335
[45] Date of Patent: *May 23, 2000

[54] READ CHANNEL IC FOR DUAL PLL SOLUTION

[75] Inventors: Koyu Yamanoi, Funabashi; Toshio Yamauchi, Yokohama; Hiroshi Kobayashi, Kawasaki, all of Japan

[73] Assignee: Silicon Systems, Inc., Tustin, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/691,353

[22] Filed: Aug. 2, 1996

[51] Int. Cl.$^7$ .................................................. H04L 7/033
[52] U.S. Cl. ............................................ 375/374; 375/376
[58] Field of Search .................................... 375/326, 327, 375/328, 374, 376

[56] References Cited

U.S. PATENT DOCUMENTS

| | | | |
|---|---|---|---|
| 3,932,705 | 1/1976 | Wulleman | 375/333 |
| 4,953,185 | 8/1990 | Goode | 375/354 |
| 5,128,809 | 7/1992 | Leis et al. | 360/51 |
| 5,170,297 | 12/1992 | Wahler et al. | 360/51 |
| 5,206,885 | 4/1993 | DeLuca et al. | 375/342 |
| 5,206,889 | 4/1993 | Unkrich | 375/354 |
| 5,450,458 | 9/1995 | Price et al. | 375/356 |
| 5,528,638 | 6/1996 | Rajivan | 375/376 |

FOREIGN PATENT DOCUMENTS

| | | | |
|---|---|---|---|
| 0 200 370 A1 | 4/1986 | European Pat. Off. | G11B 20/10 |
| 07030533 | 1/1995 | Japan | H04L 7/033 |

*Primary Examiner*—Young T. Tse
*Attorney, Agent, or Firm*—W. Daniel Swayze, Jr.; Wade James Brady, III; Frederick J. Telecky, Jr.

[57] ABSTRACT

The present invention discloses a fully integrated data synchronization circuit for a disk drive read channel system. The data synchronization system comprises dual data synchronizers to provide read reference clocks. Dual PLL circuits are coupled to the data synchronizers to provide a stable reference frequency to data synchronizers. One of the two data synchronizers is used to obtain leading edge data, while the other is for trailing edge data. Each PLL circuit comprises a phase detector, a charge pump, and a VCO. A loop filter is used in conjunction with a charge pump to control loop characteristics of the PLLs. In an idle mode, one of the PLLs is used as a time base generator to provide a stable reference frequency to data synchronizers. Once data synchronizers achieve lock using the stable reference frequency and switch over to read data, the time base generator PLL is switched over to function as a data synchronizer PLL in a read mode. Thus, one of the PLLs is used as both time base generator and data synchronizer PLL, thereby eliminating the need for extra PLL circuitry and requiring only two PLL circuits to support time base generation and data synchronization.

2 Claims, 8 Drawing Sheets

READ CHANNEL IC FOR DUAL PLL SOLUTION

BACKGROUND OF THE INVENTION

1. Field of the Invention

The present invention relates to the field of data synchronizer and time base generator circuits, particularly for dual PLL data synchronization system.

2. Background Art

Mass storage for computer systems is typically provided by a magnetic or optical media storage system, such as rigid or flexible disk storage systems. In a magnetic system, a rotating disk having a magnetic media layer on the surface is accessed by a "read/write" head which is used to store and retrieve information from the disk surface. To store information on a magnetic media disk, flux reversals are induced in the magnetic particles comprising the disk's surface. When a magnetic read/write head is passed over the flux reversals, a signal is induced in the head which can be decoded to convey information stored on the disk. Typically, the magnetic flux reversals are interpreted as "ones" or "zeros" according to the coding algorithm.

In a preformatted, write-once, or rewritable optical disk drive, data is stored as a series of pits arranged in concentric or spiral tracks on a disk surface. The read/write head is replaced by a lens assembly which is used to project a light beam, (such as a laser beam), onto the disk surface. The light beam is modulated by the pits in the disk and the modulated light beam is reflected from the disk to an optical pick up device which can produce an output signal dependent on the modulation of the light beam. In a magneto-optical disk drive, magnetic domains are oriented so that the polarization of a read light beam is modulated and this modulated beam is detected. In an optical disk drive, a movable lens assembly is mounted on a relatively large base carriage. The base carriage is moved back and forth in a radial direction relative to the optical disk. The lens assembly moves radially relative to the disk and relative to the base carriage.

When information recorded on a hard disk is recovered, it is often in the form of bit stream. To accurately decode a serial bit stream, bit frames or bit windows must be accurately defined. A one-to-one correspondence exists between each bit and each frame or window. For a variety of reasons, errors can be introduced in data bit streams that may affect the amplitude and phase of the recovered signal. Amplitude errors can be minimized by use of an automatic gain control (AGC) circuit. A phase error, also known as "jitter," is a rotation of a symbol that does not change the magnitude of the symbol. This tends to force a data bit near or past a bit window boundary.

To maximize the efficiency of data recovery, the average bit position can be estimated with a decode window having a nominal center coinciding with the average center bit position of the data bit stream. However, problems still exist when the jitter causes the bit position to extend over a window edge.

To determine a decode window with acceptable timing accuracy, clock recovery circuits can be provided utilizing phase locking via a phase locked loop (PLL) to generate both edges of a window. A PLL circuit is implemented for synchronization to produce a clock signal equal in frequency to the data rate of the signal read from the disk media. The PLL circuit acquires the nominal frequency of the read signal and tracks deviations in its nominal frequency, thereby producing an output clock frequency that varies according to deviations of the reference frequency (frequency of the read signal). Thus, For 3.5" 640 MByte type magneto-optical disks, the standard format uses the (1,7) RLL (Run Length Limited) coding in conjunction with PWM (Pit width Modulation) recording scheme in accordance with ISO (International Organization for Standardization) standards. FIG. 1 shows the PWM recording data and read signals. The read data is changed from '0' to '1' (or '1' to '0') when the encoded data is '1'. Therefore, both rising and falling edges indicate the data signal on the media.

FIG. 2 shows a typical prior art read channel system, which consists of an analog front end, which comprises AGC 201, programmable equalizer filter 202, and data qualifier 204, a time base generator 210 and data synchronizer 206 and 207. Full wave rectifier 203 couples the output of equalizer filter 202 to AGC 201 in a feedback loop. An output of data qualifier 204 is coupled to PLL1 205 and data synchronizer 206. Another output of data qualifier 204 is coupled to PLL2 208 and data synchronizer 207. The data qualifier 204 transforms each valid analog read data pulses into a digital pulse, while preserving the relative time position of each valid pulse edge.

A reference signal $F_{REF}$ is coupled to time base generator 210, which is coupled to PLL3 209. The output of time base generator 210 is coupled to PLL1 205, PLL2 208, and CLOCK terminal. Both time base generator 210 and data synchronizers 206 and 207 are based on a PLL circuit. Time base generator 210 is programmed to provide a stable reference frequency for data synchronizers. The output clock of time base generator 210 can be either PLL3 209 output or time base generator's $F_{REF}$ input signal.

In PWM recordings for optical and magneto-optical disk, the read signal is sliced by the floating slice level in the data qualifier. The signal comprises both edges of the pit mark. The formed pit length depends on the recording conditions (write power, media, slew rate of the laser driver, etc.) and data pattern. Hence, both edges (leading edge and trailing edge) need to be treated independently. As both edges require separate PLLs, and are synchronized independently, the decode window margins may also vary.

There are usually 3 PLL circuits in a read channel circuit: 2 PLL circuits for the data synchronizer, and one PLL for the time base generator. The output clock of the time base generator 210 is used as the reference clock for the data synchronizer PLLs in the idle mode and write clock in write mode.

In this prior art method, the 3 PLL circuits in the chip are asynchronous. Also, it is inefficient to include 3 PLL circuits in a same chip since it requires bigger die size and may deteriorate the jitter performance of the clock outputs. Since the PLL circuit is an analog based solution (including VCO and phase detector), the circuit area is large compared to other circuits in the read channel IC.

Further, these prior art PLLs are locked asynchronously in read mode, requiring an isolation of the power lines and signal lines to avoid the cross-talk between signals. Thus, this prior art method requires a large chip size and dissipates much power.

Thus, there is a need in the art to overcome the shortcomings of the prior art data synchronizers and provide a data synchronizer that is compact in size and efficient in power consumption and can deliver an improved and reliable data synchronization capability.

SUMMARY OF THE INVENTION

The present invention discloses a fully integrated data synchronization circuit for both optical and magneto-optical disk drive (ODD and MOD) read channel system. The data synchronization system comprises dual data synchronizers that provide read reference clocks. Dual PLL circuits are coupled to the data synchronizers to provide a stable reference frequency to data synchronizers. One of the two data synchronizers is used to obtain leading edge data, while the other is for trailing edge data. Each PLL circuit comprises a phase detector, a charge pump, and a VCO. A loop filter is used in conjunction with a charge pump to control loop characteristics of the PLLs.

In an idle mode, one of the PLLs is used as a time base generator to provide a stable reference frequency to data synchronizers. Once data synchronizers achieve lock using the stable reference frequency and switch over to read data, the time base generator PLL is switched over to function as a data synchronizer PLL in a read mode. Thus, one of the PLLs is used as both time base generator and data synchronizer PLL, thereby eliminating the need for extra PLL circuitry and requiring only two PLL circuits to support time base generation and data synchronization, reducing die size and power dissipation and improving jitter performance. The invention also allows synchronous locking of data synchronizers, minimizing decode window margin variations.

DETAILED DESCRIPTION OF THE PRESENT INVENTION

A data synchronization circuit is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

In the magneto-optical disk drive (MOD) and optical disk drive (ODD), information written on data storage disks are accessed by optical pick-up devices. To accurately access the data tracks, servo information is written onto storage disks and provide positioning information in a sector ID (identifier). In a tracking servo scheme, pie-shaped wedges of servo information are interweaved between sections of data information.

Figure 1:
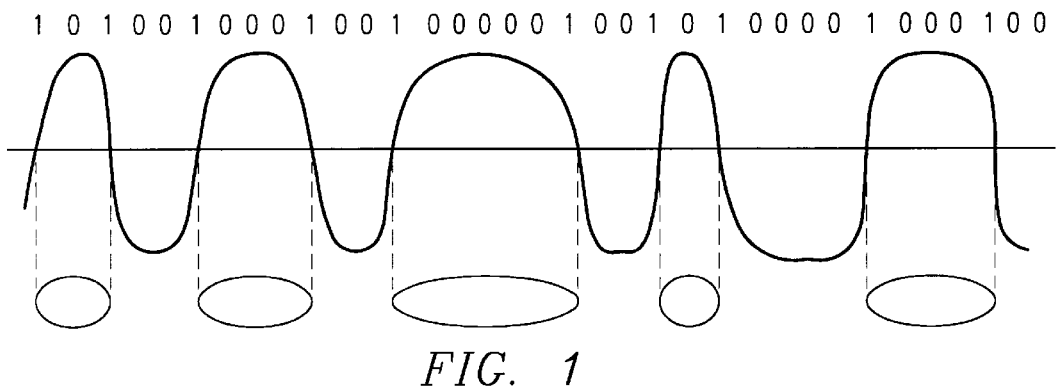
FIG. 1 shows the PWM recording data and read signals.
Figure 2:
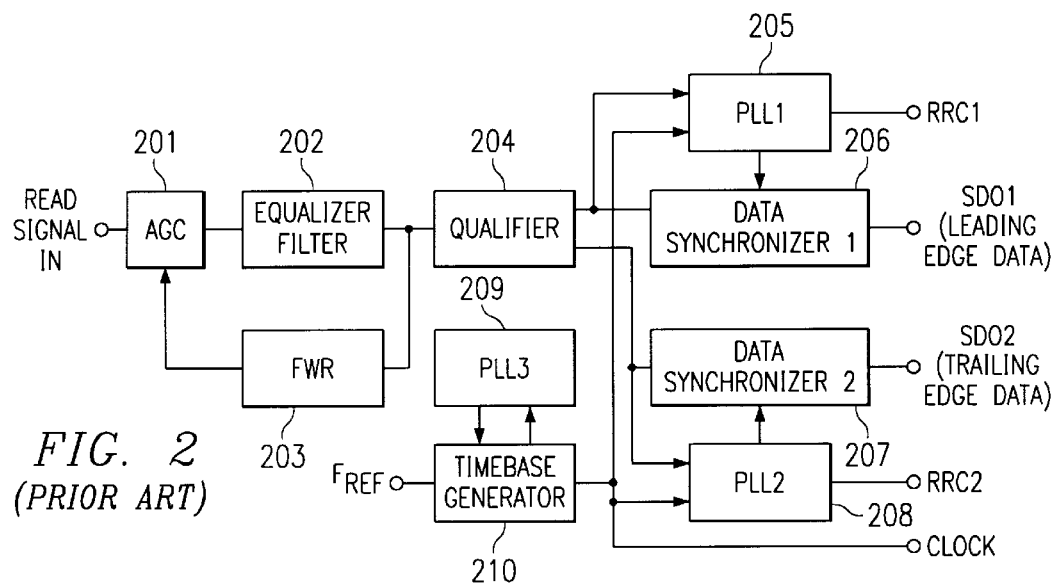
FIG. 2 shows a typical prior art read channel system.
Figure 3:
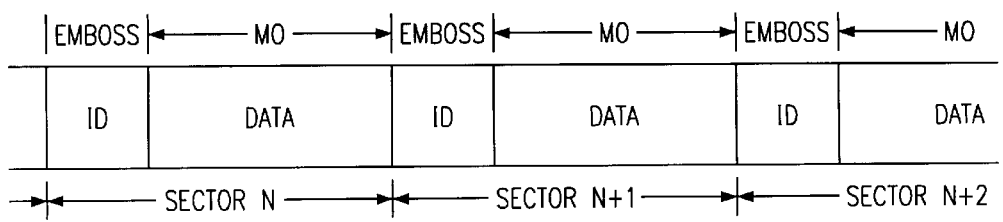
FIG. 3 illustrates a format of data track encoding in a servo sector scheme.

The servo information permits the definition of individual data tracks on the data surfaces of the disk drive. The data tracks may be further divided into a plurality of smaller fields, or "sectors". A header field can be used to independently verify the location of individual sectors and tracks. FIG. 3 illustrates a format of data track encoding in a servo sector scheme. A header field precedes each data sector on each data track and contains identifier (ID) information which is unique to that sector over the entire drive. A typical identifier includes the track number and the sector number. The header may also contain other information related to media defects and redundancy information for error detection.

During operations of reading or writing data, the controller reads the header of each data sector as it is encountered and applies various tests to the information contained therein, including the comparison of the ID which was read to the ID which was expected. If the various tests are passed and the ID read matches the ID expected, then the subsequent data part of the sector is read or written appropriately. Because each sector is uniquely and independently identified, the incorrect identification of any sector will not affect the correct identification of any subsequent sectors.

In addition to a header, a sector comprises offset detection field (ODF) and a recording field in which 512, 1024 or 2048 user data bytes can be recorded. As can be seen in FIG. 3, the header of each sector is embossed (pre-formatted). The emboss area is also known as pre-pit.

According to 3.5" ISO 640 MByte type standard format, the length of the header field is defined as 63 bytes. When the emboss period is 19.3 $\mu s$, user data periods are 211.2 $\mu sec/512$ byte sector and 766 $\mu sec/2048$ byte sector in outer track; when the emboss period is 34.6 $\mu s$, user data periods are 369 $\mu sec/512$ byte sector and 1370 $\mu sec/2048$ byte sector in inner track. The disk rotation speed is 3000 rpm at 50 Hz. The recording field can be empty, user-written or embossed.

Figure 4:
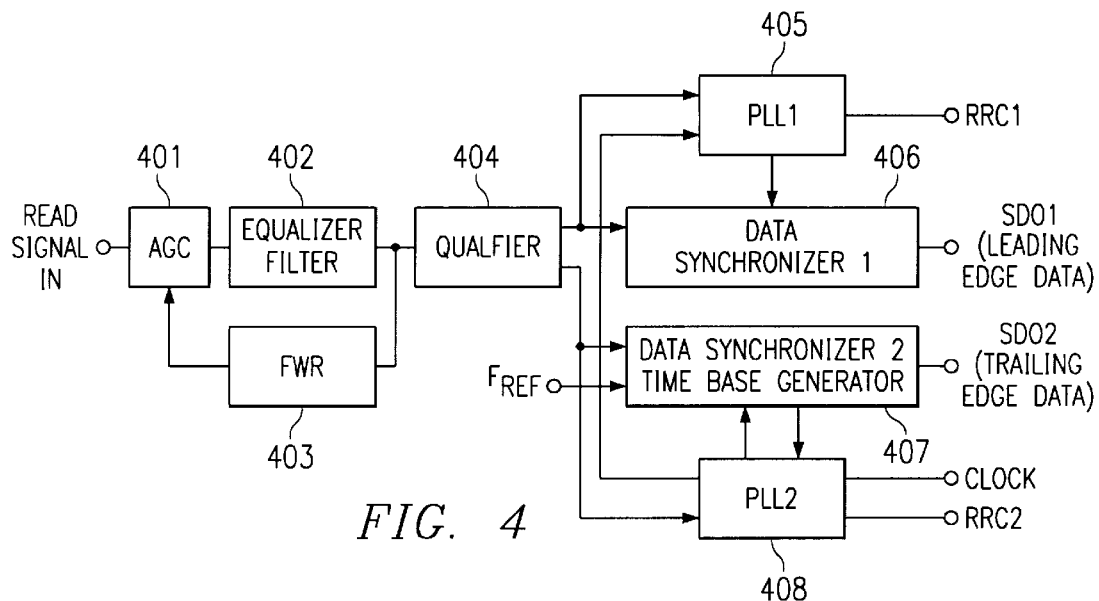
FIG. 4 shows a preferred embodiment of the invention.

FIG. 4 shows an embodiment of the invention. As can be seen in FIG. 4, this embodiment uses two PLL circuits for time base generation and data synchronization. Referring to FIG. 4, an output of data qualifier 404 is coupled to PLL1 405 and data synchronizer 406. Another output of data qualifier 404 is coupled to PLL2 408 and data synchronizer/time base generator 407. A reference signal $F_{REF}$ is coupled to data synchronizer/time base generator 407. PLL2 408 is coupled to PLL1 405 and data synchronizer/time base generator 407. The PLL2 408 serves both as a time base generator in idle mode and second data synchronizer PLL in read mode.

Referring to FIG. 4, an output of data synchronizer 1 is coupled to SDO1 and an output of data synchronizer 2 is coupled to SDO2, SDO1 represents leading edge data while SDO2 represents trailing edge data. An output of PLL1 is coupled to RRC1 and an output of PLL2 is coupled to RRC2. Another output of PLL2 408 is coupled to CLOCK.

In FIG. 4, block 407 comprises a time base generator and a data synchronizer. Data synchronizers 406 and 407 perform data synchronization in the read mode.

The time base generator portion of 407 provides programmable reference frequency. In idle mode, the time base generator portion of 407 is programmed to provide a stable frequency to the data synchronizer portion of 407. In read mode, however, the phase detector reference is switched from the base generator to the VCO clock signal and the output of the time base generator 407 is only used as a clock count for the sector mark detection window. Switching the source of the phase detector reference from the base generator to the VCO clock signal helps minimize jitter in the data synchronizer PLL.

Therefore, in read mode, it is possible to use the PLL2 408 as a data synchronizer PLL instead of as a time base generator such that it acts as the second synchronizer PLL for the trailing edge of the incoming signal in read mode. During this time, the time base generator frequency can be maintained via the loop filter voltage.

Figure 5A:
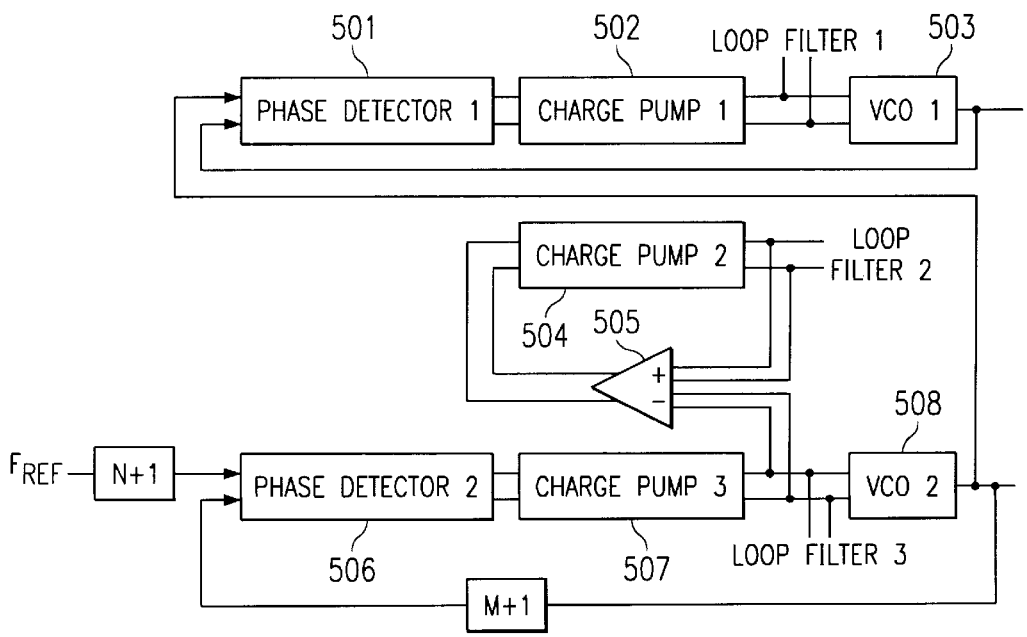
FIGS. 5A, 5B, and 5C show the block diagrams of idle and read operations for PWM mode according to one embodiment of the invention.
Figure 5B:
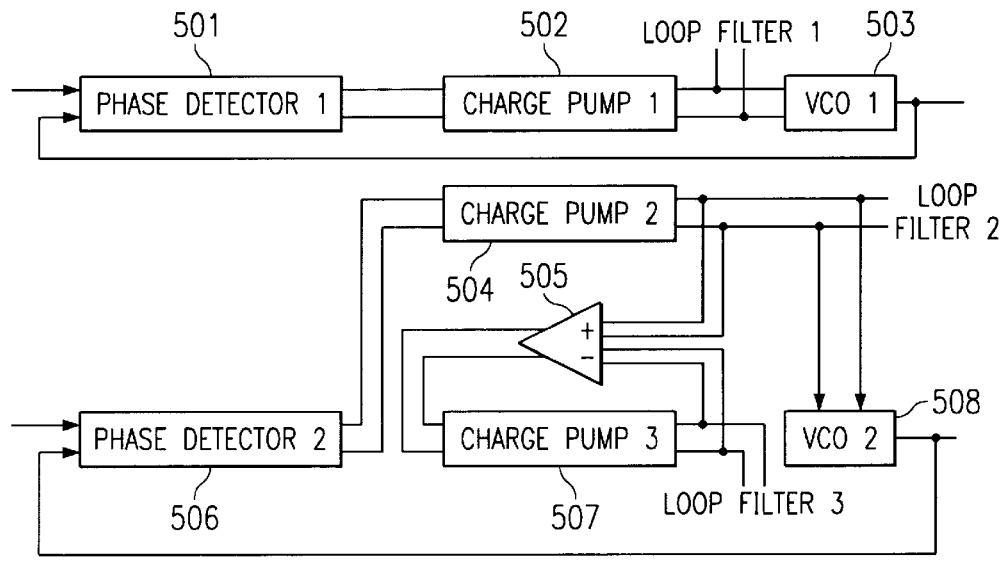
Figure 5C:
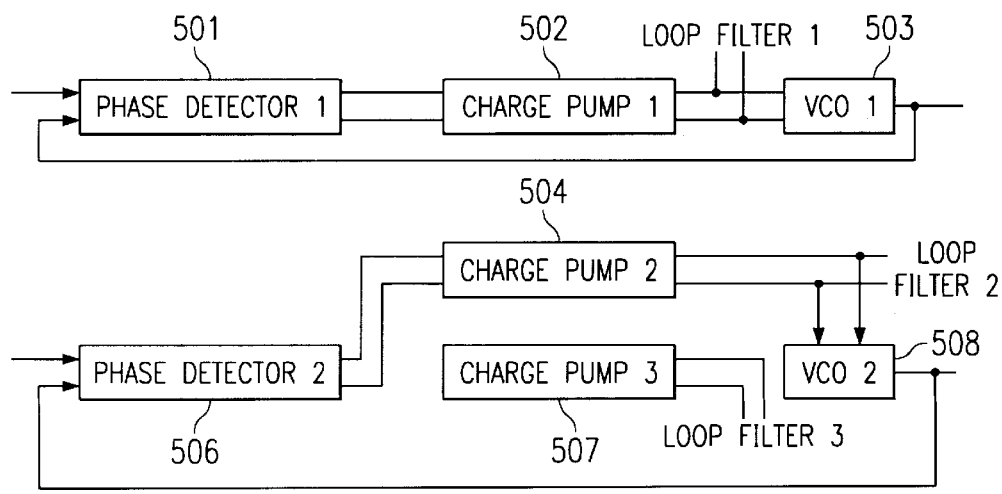

FIGS. 5A, 5B, and 5C show the block diagrams of idle and read operations for PWM mode according to one embodiment of the invention. Referring to FIG. 5A, the first PLL loop comprises phase detector 501, charge pump 502, VCO1 503, and loop filter 1. Loop filter 1 provides loop voltage to VCO1 503. Charge pump 502 increases, decreases, or maintains the loop voltage generated by loop filter 1 to control the VCO frequency. Charge pump is well known in the art and is, therefore, not shown in greater detail. Loop filters 1, 2, and 3 are external passive filters comprising a capacitor and/or a resistor for controlling PLL locking characteristics.

Referring to FIG. 5A, in an idle mode, the second PLL loop comprising phase detector 506, charge pump 507, VCO2 508, loop filter 3 acts as a time base generator PLL with the N+1 and M+1 dividers and provides reference to the $F_{REF}$ input. Thus, the phase detection rate in an idle mode is dependent on the values of $F_{REF}$ and N+1. In one embodiment of the invention, counters are used to provide divide-by-N and divide-by-M operations. The first PLL loop acts as a data synchronizer PLL reference for the time base generator output. The voltage of loop filter 2 is maintained to be the same voltage as the loop filter 3 by the comparator 505 having feedback loop through charge pump 504. During idle mode, data synchronizers 406 and 407 achieve lock using the output of the time base generator before switching over to read mode.

Although the PLLs shown in FIG. 5A comprises a phase detector, charge pump, and a VCO, it would be appreciated by those skilled in the art that any suitable PLL architecture can be used without departing the scope of the invention.

Referring to FIG. 5C, in the MO or user data read mode, the first PLL loop comprising phase detector 501, charge pump 502, VCO 503, and loop filter 1 acts as the first data synchronizer PLL and provides reference to the, the leading edge of the data. The second PLL loop comprising phase detector 506, charge pump 504, VCO 508 and loop filter 2 acts as a second data synchronizer PLL and provides reference to the, the trailing edge of the data.

As can be seen in FIG. 5C, loop filter 3 is isolated from the internal circuit. There is no input to the charge pump 3 and loop filter 3 retains the voltage of the idle mode. The voltage of loop filter 3 can be maintained by an external capacitor, but would be susceptible to current leakage and may experience voltage drop. However, the maximum period of the MO read mode does not exceed 1370 μs even at 3000 rpm so that when a 1500 pF capacitor is used in the loop filter 3 and 50 nA leakage current is assumed, the loop filter 3 voltage drop is approximately 46 mV, a negligible amount. Thus, if the VCO control gain is designed to be 0.2 wi rad/VS, less than 1% variation is expected in VCO frequency. In the MO read mode, the VCO2 output frequency is dependent on the write drive clock frequency and the disk revolution speed.

Referring to FIG. 5B, in the emboss or header read mode, the first and second PLL loops perform the same function as in the MO read mode except that the charge pump 507 is controlled by the outputs of the comparator 505 which has inputs coupled to the outputs of charge pump 507 and charge pump 504. Therefore, the voltage of loop filter 3 is maintained at the same voltage as the loop filter 2 by the comparator 505 having feedback loop through charge pump 3 during this mode. This configuration is for the continuous sector read mode.

When several sectors are read continuously, the loop filter 3 voltage is maintained at a constant level. However, it is difficult to keep the voltage constant for a long time because of the current leakage. Thus, using the emboss data (header), the loop filter 3 voltage is refreshed with feedback to the charge pump 507 from the comparator 505 output of the voltage difference between loop filter 2 and loop filter 3. Since the header exists in every sector, there is enough time to refresh for at least 19 μs of the header period. This refresh scheme prevents the voltage of loop filter 3 from drifting due to leakage current. The emboss data frequency is independent of the write drive and dependent on the revolution speed of the read drive. In the emboss read mode, the VCO2 output frequency is approximately the same as that of the idle mode.

Loop filters 1, 2, and 3 may use components of different values (for capacitors and/or resistors) to provide different loop filter characteristics depending on the phase detection rates in read and idle modes. It can be seen from FIGS. 5A, 5B, and 5C that the second PLL loop uses loop filter 3 for time base generation in idle mode and loop filter 2 for phase locking in MO and emboss read modes.

Figure 5D:
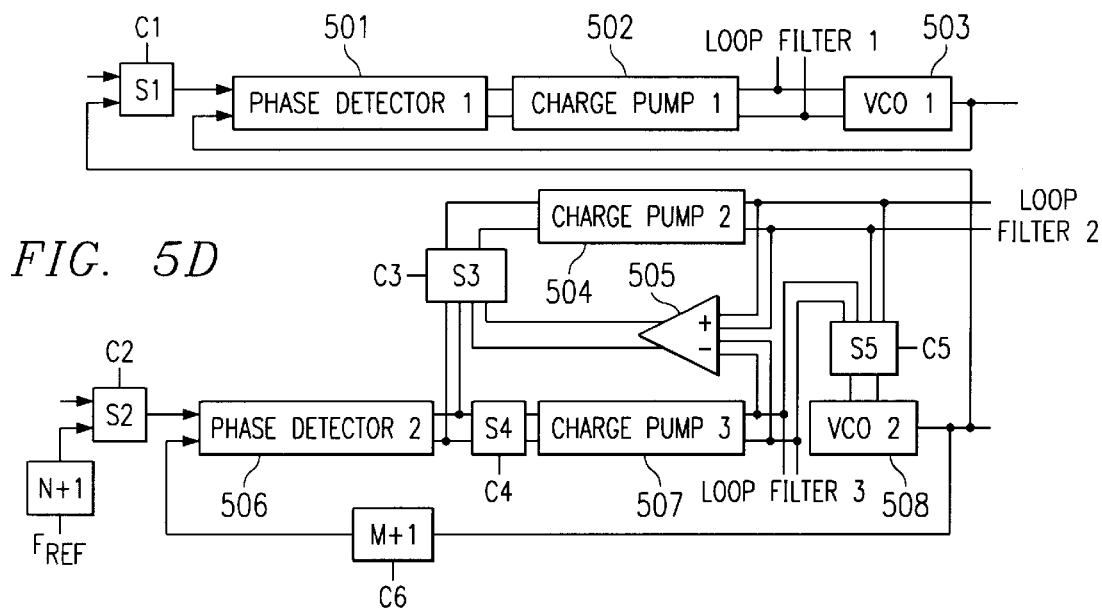
FIG. 5D is a block diagram of one embodiment of the invention.

FIG. 5D is a block diagram of an embodiment of the invention. In FIG. 5D, DRD1* and the output of VCO2 are coupled to switch or multiplexer S, which selects an input to phase detector 1. DRD2* and $F_{REF}$ divided by N+1 are coupled to switch or multiplexer S2, which selects an input to phase detector 2. C1 and C2 are control signals for switches or multiplexers S1 and S2, respectively.

Referring to FIG. 5D, the output of phase detector 2 and comparator 505 are coupled to switch or multiplexer S3, which selects an input to charge pump 2 based upon control signal C3. Switch or multiplexer S4 is coupled between phase detector 2 and charge pump 3 to pass the output of phase detector 2 depending upon control signal C4. The outputs of charge pumps 2 and 3 are coupled to switch or multiplexer S5, which selects an input to VCO 2 based upon control signal C5. M+1 divider has control signal C6 to enable division operation.

Figure 6A:
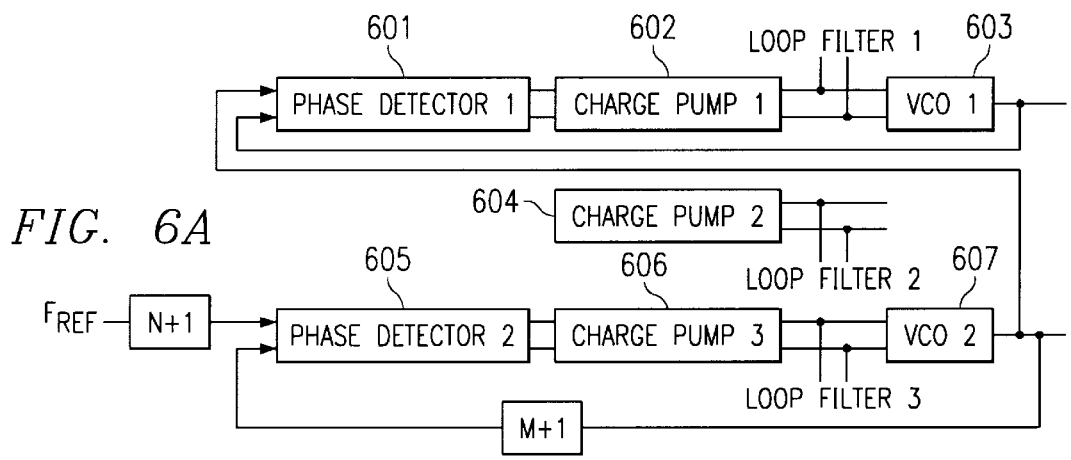
FIGS. 6A and 6B show the block diagrams of idle and read operations for PPM mode in accordance with one embodiment of the invention.
Figure 6B:
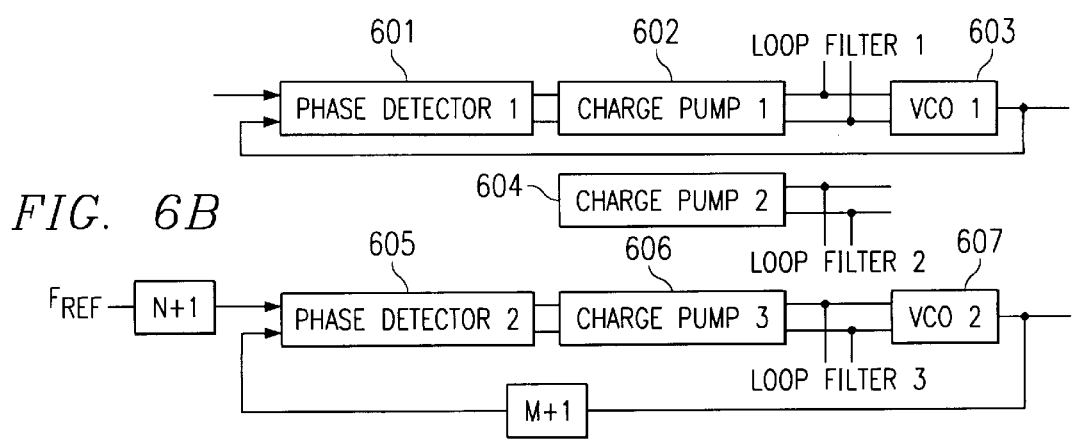

Although the above discussion describes and illustrates various embodiments of the invention for PWM mode operations, it would be appreciated by one skilled in the art that the invention is not limited to PWM mode operations and can be used in conjunction with any other suitable recording scheme. For example, ISO standard magneto-optical drive should support PPM mode for the backward compatibility. FIGS. 6A and 6B show the block diagrams of idle and read operations for PPM (Pit Position Modulation) mode in accordance with one embodiment of the invention.

Referring to FIGS. 6A and 6B, the VCO 1 and VCO 2 are operated the same way as in the conventional system. VCO 2 acts as the time base generator while VCO 1 acts as a data synchronizer VCO. Loop filter 2 is not used in this mode. Charge pump 2 and loop filter 2 are not used in PPM mode since in PPM, unlike PWM that requires leading edge and trailing edge synchronization, only one synchronization is required.

Referring to FIG. 6A, phase detector 601 is coupled to charge pump 602, which is coupled to VCO 603. An output of VCO 603 is coupled to phase detector 601. Phase detector 605 is coupled to charge pump 606, which is coupled to VCO 607. An output of VCO 607 is coupled to phase detector 601 and phase detector 605 for feedback.

Referring to FIG. 6B, phase detector 601 is coupled to charge pump 602, which is coupled to VCO 603. An output of VCO 603 is coupled to phase detector 601. Input DRD1* is coupled to phase detector 601. Phase detector 605 is coupled to charge pump 606, which is coupled to VCO 607. An output of VCO 607 is coupled to phase detector 605 in a feedback loop. Input $F_{REF}$ is coupled to phase detector 605.

Figure 7A:
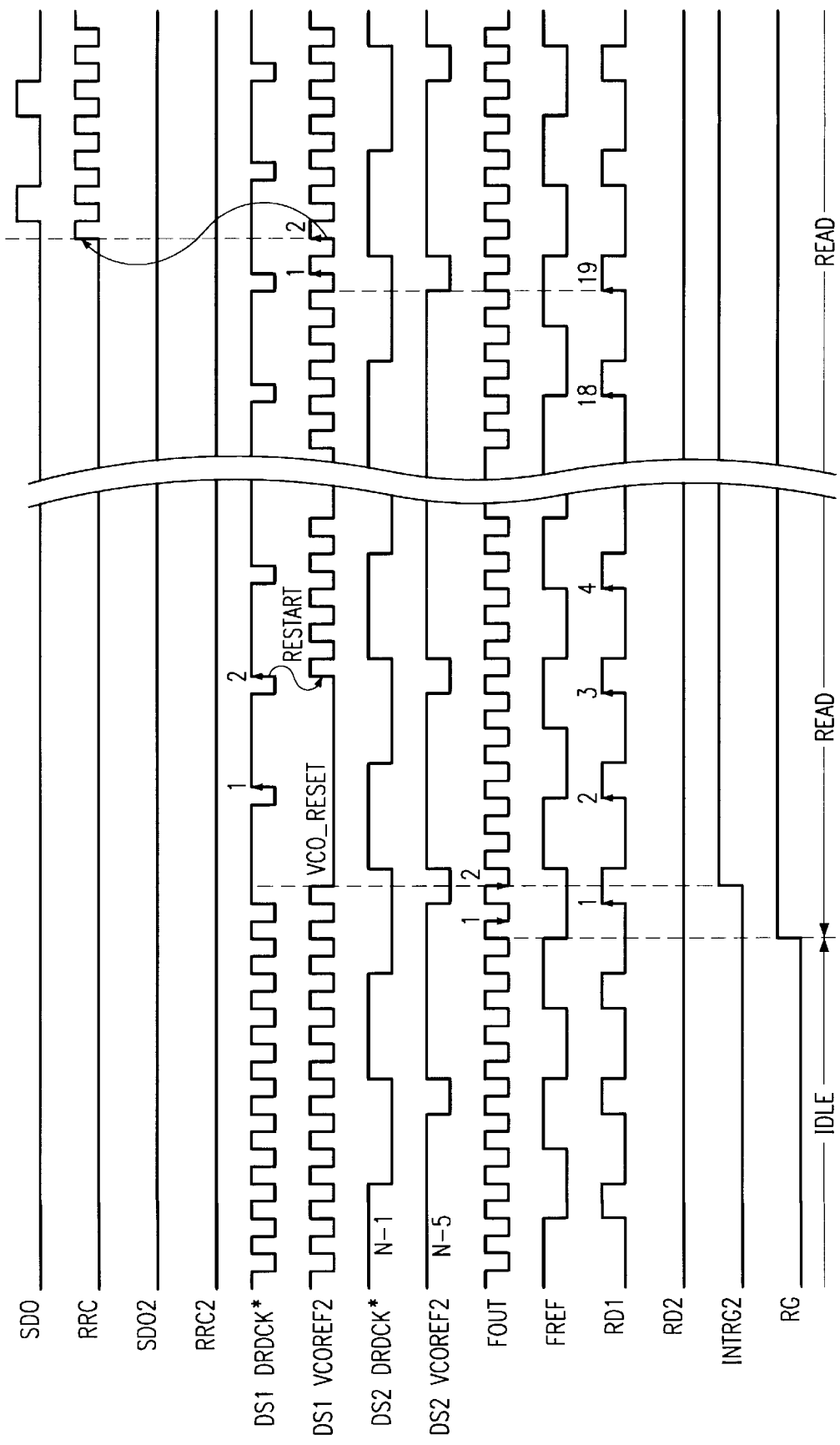
FIG. 7 shows lock-on/lock-ending sequence waveform diagrams in PPM mode.
Figure 7B:
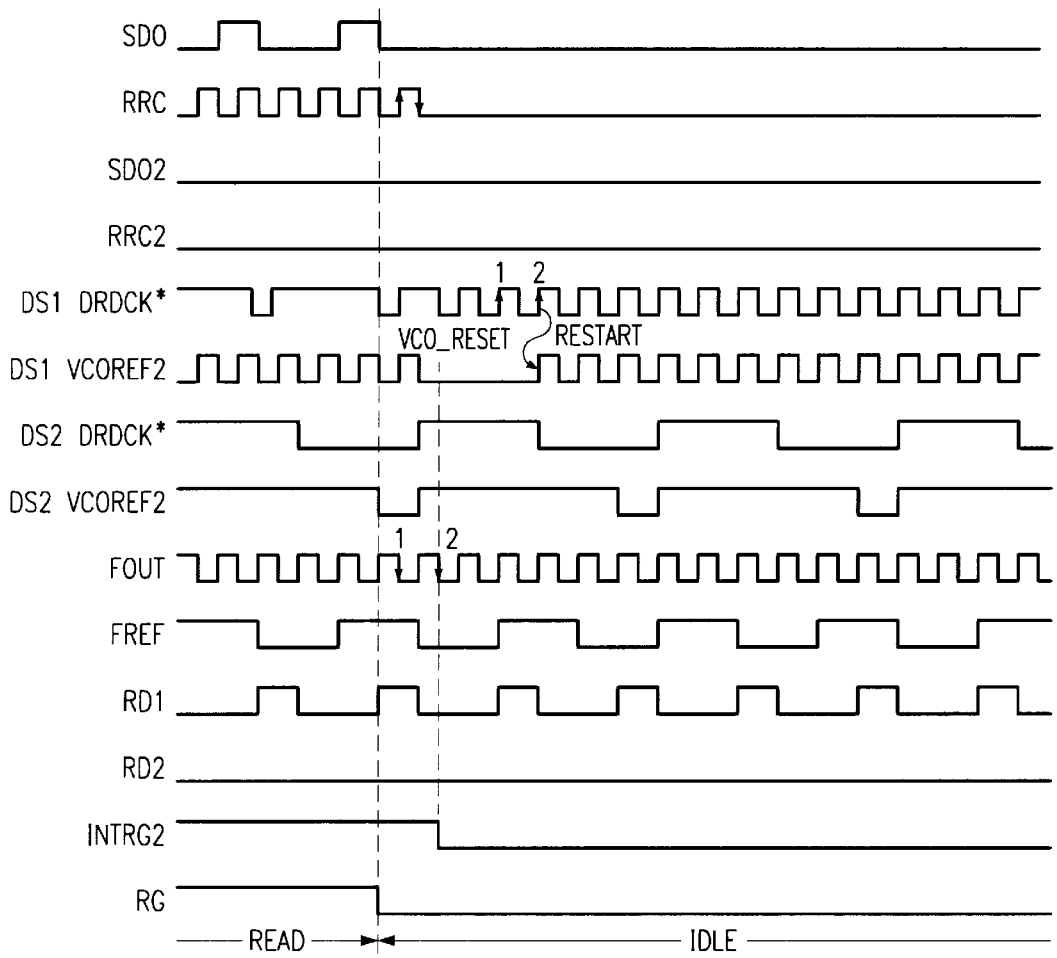
Figure 8A:
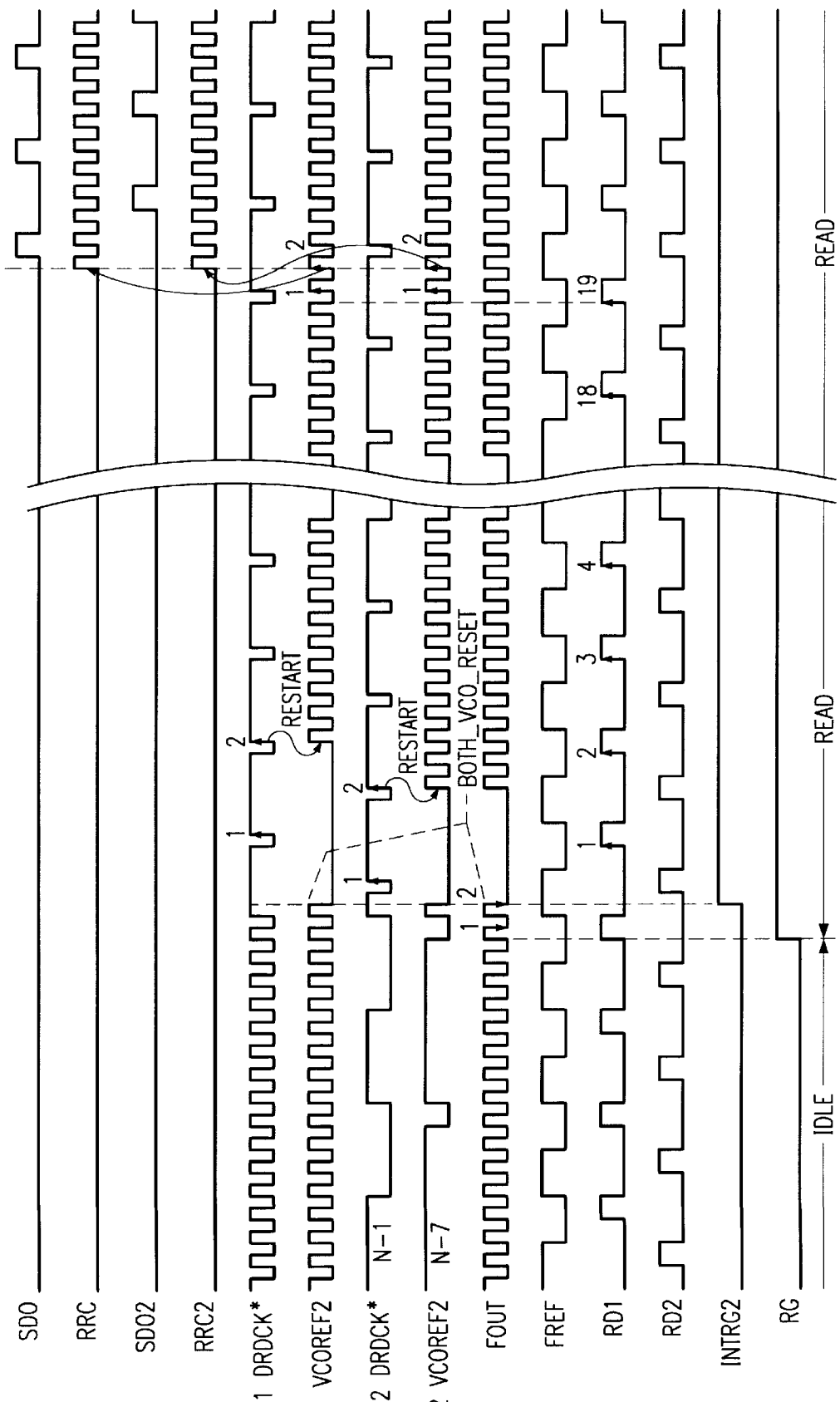
FIG. 8 shows lock-on/lock-ending sequence waveform diagrams in PWM mode.
Figure 8B:
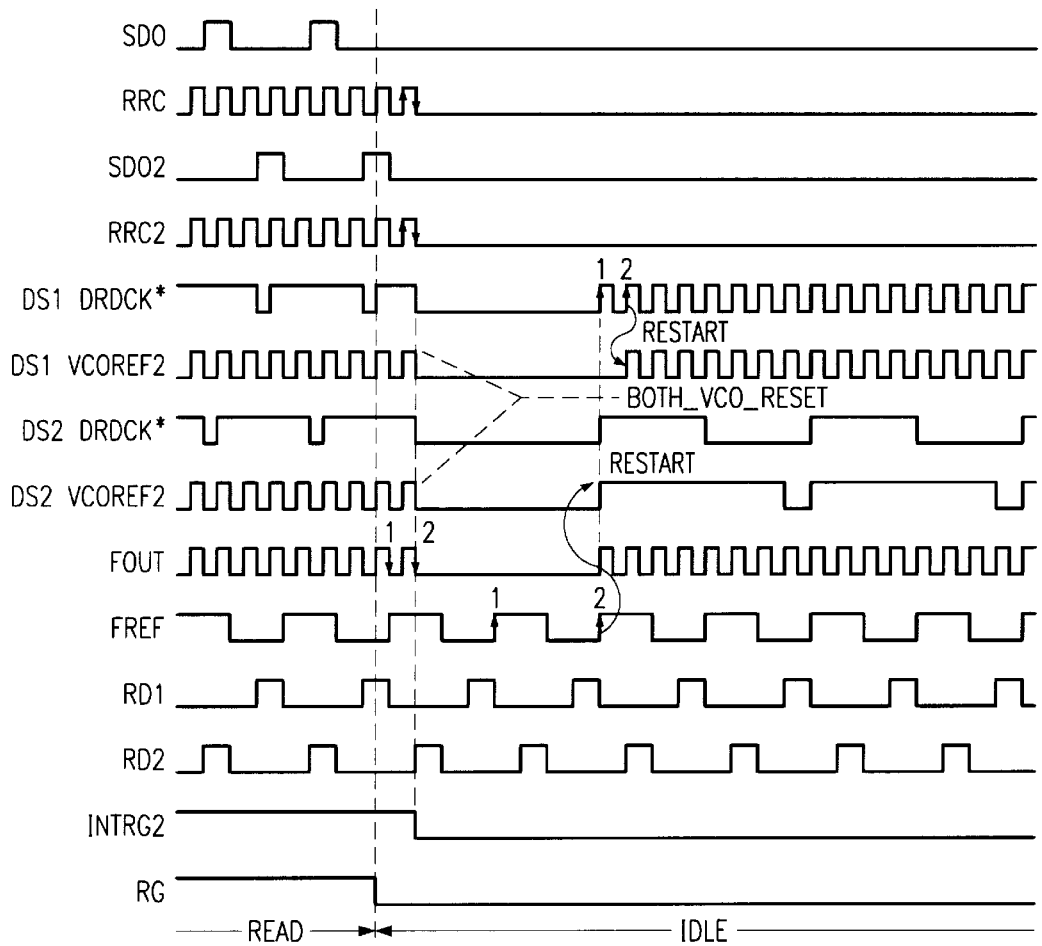

FIGS. 7 and 8 show the timing waveforms for the embodiments shown in FIGS. 5A, 5B, 5C, 6A, and 6B. SDO is a synchronized read data output and the leading edge data in PWM mode, while SDO2 is a synchronized read data output and the trailing edge data. RRC is a read reference clock output from VCO1 and RRC2 is a read reference clock output from VCO2. DS1/DRDCK* and DS1/VCOREF2 are phase detector 1 inputs, while DS2/DRDCK* and DS2/VCOREF2 are phase detector 2 inputs. FOUT is a time base generator VCO output. $F_{REF}$ is the reference frequency for the time base generator. RD1 is the row data input signal from the leading edge. RD2 is the row data input signal from the trailing edge. INTRG2 is the synchronized internal read gate signal and RG is the asynchronous read gate signal.

FIG. 7 shows lock-on/lock-ending sequence waveform diagrams in PPM mode. Read gate (RG) signal initiates the PLL locking sequence and selected the PLL reference input. When the RG is asserted to the high level, the DS1/VCOREF2(VCO1) is reset by the second falling edge of the FOUT. The next zero-phase restart is between DS1/DRDCK* and VCO1 at the rising edge of the DS1/DRDCK* from the third RD1. When the internal counter counts the nineteenth RD1, the RRC and SDO outputs are enabled. When the RG is negated, the DS1/VCOREF2 (VCO1) is reset by the second falling edge of the FOUT, and zero-phase between VCO2 and VCO1 to restart at the rising edge of second or third DS1/DRDCK* pulse.

FIG. 8 shows lock-on/lock-ending sequence waveform diagrams in PWM mode. When the RG is asserted to the high level, the DS1/VCOREF2(VCO1) and DS2/VCOREF2 are reset by the second falling edge of the FOUT. The next zero-phase restart is between DS1/DRDCK* and VCO at the rising edge of the DS1/DRDCK* from the second RD1. Another zero-phase restart is between DS2/DRDCK* and VCO2 at the rising edge of the DS2/DRDCK* from the second RD2. While the VCOs are reset, the input of phase detector 1 in FIG. 5 is switched from VCO2 output to the DRD1*. The input of phase detector 2 is switched from $F_{REF}/(N+1)$ to DRD2* and charge pump 3 to charge pump 2. DRD1* and DRD2* are delayed read data pluses. As the loop filter 2 voltage and loop filter 3 voltage are maintained by comparator feedback, the VCO2 oscillates at the same frequency as in the idle mode. The gain of the comparator is about 6 dB, and the input offset is less than 10 mV.

When the internal counter counts the nineteenth RD1 (leading edge), the RRC, RRC2, SDO and SDO2 outputs are enabled. When the RG is negated, the DS1/VCOREF2 (VCO1) and DS2/VCOREF2 (VCO2) are reset by the second falling edge of the FOUT (same as VCO2), and zero-phase restart between VCO2 and $F_{REF}$ at the rising edge of the second $F_{REF}$ pulse. Another zero-phase restart is between VCO1 and VCO2 at the rising edge of second restarted VCO2 pulse.

The present invention thus provides accurate and reliable time base generator and data synchronizer. As stated above, the advantages of the invention are particularly valuable in dual PLL data synchronization system. The advantages of the present invention include: The read channel IC requires only two PLLs for PPM and PWM applications, thus saving valuable silicon real estate and cost. Further, data synchronizers are synchronized by a common reference signal, minimizing decode window margin variations. Moreover, die size and power dissipation are reduced and jitter performance is improved.

Thus, an integrated circuit technology compatible data synchronizer and time base generator which incorporates dual PLL circuits has been described.

It is understood that particular embodiments described herein should not limit the present invention thereby. It would also be appreciated by those skilled in the art that changes in various details may be made without departing from the invention defined in the appended claims.

We claim:

1. A data synchronization system comprising:

a first data synchronizer;

a second data synchronizer;

a first phase locked loop (PLL) coupled to said first data synchronizer;

a second PLL coupled to said second data synchronizer including a phase detector;

a first charge pump;

a voltage controlled oscillator (VCO);

a second charge pump; and a comparator switchably coupled to said first charge pump and to said second charge pump.

2. The system of claim 1 further comprising a loop filter coupled to said second charge pump.

* * * * *